US008519262B2

(12) United States Patent
Sivarajan et al.

(10) Patent No.: US 8,519,262 B2
(45) Date of Patent: Aug. 27, 2013

(54) FULLERENE-FUNCTIONALIZED PARTICLES, METHODS FOR MAKING THE SAME AND THEIR USE IN BULK-HETEROJUNCTION ORGANIC PHOTOVOLTAIC DEVICES

(75) Inventors: Ramesh Sivarajan, Shrewsbury, MA (US); Henning Richter, Newton, MA (US); Angela Herring, Jamaica Plain, MA (US); Thomas A. Lada, Winthrop, MA (US); Viktor Vejins, Concord, MA (US)

(73) Assignee: Nano-C, Inc., Westwood, MA (US)

( * ) Notice: Subject to any disclaimer, the term of this patent is extended or adjusted under 35 U.S.C. 154(b) by 221 days.

(21) Appl. No.: 12/941,838

(22) Filed: Nov. 8, 2010

(65) Prior Publication Data

US 2011/0132440 A1 Jun. 9, 2011

Related U.S. Application Data

(60) Provisional application No. 61/258,906, filed on Nov. 6, 2009, provisional application No. 61/352,236, filed on Jun. 7, 2010.

(51) Int. Cl.
*H01L 31/0352* (2006.01)
*H01L 31/04* (2006.01)
*H01L 31/18* (2006.01)
*B32B 5/16* (2006.01)

(52) U.S. Cl.
USPC .......... 136/263; 136/243; 977/730; 977/734; 977/736; 977/773; 428/403; 427/74

(58) Field of Classification Search
None
See application file for complete search history.

(56) References Cited

U.S. PATENT DOCUMENTS

| 4,521,490 | A | * | 6/1985 | Pocius et al. | 428/416 |
| 5,874,134 | A | * | 2/1999 | Rao et al. | 427/446 |
| 5,922,410 | A | * | 7/1999 | Swartz et al. | 427/393 |
| 6,008,069 | A | * | 12/1999 | Yamada | 438/113 |
| 6,277,766 | B1 | | 8/2001 | Ayers | |
| 6,344,272 | B1 | * | 2/2002 | Oldenburg et al. | 428/403 |

(Continued)

FOREIGN PATENT DOCUMENTS

WO WO-2008027898 A2 3/2008

OTHER PUBLICATIONS

Belik, A., et al., "Reaction of Buckminsterfullerene with ortho-Quinodimethane: a New Access to Stable $C_{60}$ Derivatives," *Angew. Chem. Int. Ed. Engl.* 1993, 32, 78-80.

(Continued)

*Primary Examiner* — Jennifer Michener
*Assistant Examiner* — Matthew Zapadka
(74) *Attorney, Agent, or Firm* — Wilmer Cutler Pickering Hale & Dorr LLP

(57) ABSTRACT

Core shell particles and bulk-heterojunction organic photovoltaic devices using the core shell particles are described. In particular, core shell particles having a core particle and a shell of a second material and bulk-heterojunction organic photovoltaic devices using the core-shell particles are described. The core-shell particles can have a core particle with an electron donating material or a core particle with an electron donating material. Formation of a hulk-heterojunction organic photovoltaic device using such an core-shell particles forming an interpenetrating network with the an electron donating or electron accepting phase is also described.

10 Claims, 16 Drawing Sheets

(56) References Cited

U.S. PATENT DOCUMENTS

| | | | |
|---|---|---|---|
| 6,580,027 B2 * | 6/2003 | Forrest et al. | 136/263 |
| 6,852,920 B2 * | 2/2005 | Sager et al. | 136/263 |
| 2003/0201010 A1 * | 10/2003 | Koyanagi et al. | 136/263 |
| 2003/0226498 A1 | 12/2003 | Alivisatos et al. | |
| 2008/0087314 A1 * | 4/2008 | Xiao et al. | 136/201 |
| 2009/0205713 A1 | 8/2009 | Mitra et al. | |
| 2010/0300529 A1 * | 12/2010 | Kawahara et al. | 136/256 |

OTHER PUBLICATIONS

Bingel, C. "Cyclopropanierung von fullerenen," *Chem. Ber.* 1993, 126, 1957-1959.

Chiang, L.Y., et al., "Multi-hydroxy additions onto $C_{60}$ fullerene molecules," *J. Chem. Soc., Chem. Commun.* 1992, 1791-1793.

Gunes, S. et al., "Conjugated Polymer-Based Organic Solar Cells," *Chem. Rev*, vol. 107: 1324-1338 (2007).

Hoppe, H. and Sariciftci, N.S., "Morphology of polymer/fullerene bulk heterojunction solar cells," *J. Mater. Chem.* 2006, 16, 45-61.

Hummelen, J.D. et al., "Preparation and characterization of fulleroid and methanofullerene derivatives," *J. Org. Chem.* 1995, 60, 532-538.

International Search Report issued for PCT/US2010/055860, dated May 6, 2011 (2 pages).

Jensen, A.W. and Daniels, C., "Fullerene-Coated Beads as Reusable Catalysts," *J. Org. Chem.*, 68(2): 207-210 (2003).

Kooistra, F.B., et al., "Increasing the open circuit voltage of bulk heterojunction solar cells by raising the LUMO level of the acceptor," *Org. Lett.* 2007, 9, 551-554.

Lenes, M. et al., "Fullerene bisadducts for enhanced open-circuit voltages and efficiencies in polymer solar cells," *Adv. Mater.* 2008, 20, 2116-2119.

Mayer, A.C. et al., "Polymer-based solar cells," *Materials Today*, vol. 10(11): 28-33 (Nov. 2007).

Patwardhan, S.V., et al., "Effect of Process Parameters on the the Polymer Mediated Synthesis of Silica at Neutral pH," *Silicon Chemisty* 2002, pp. 47-55.

Puplovskis, A. et al., "New Route for [60]Fullerene Functionalization in [4+2] Cycloaddition Reaction Using Indene," *Tetrahedron Lett.* 1997, 38, 285-288.

Ramesh, S., et al. "Organized Silica Microspheres Carrying Ferromagnetic Cobalt Nanoparticles as a Basis for Tip Arrays in Magnetic Force Microscopy," *J. Phys. Chem. B* 1998, 102, 10234-10242.

Reese et. al. "Optimal negative electrodes for poly(3-hexylthiophene):[6,6]-phenyl C61-butyric acid methyl ester bulk heterojunciton photovoltaic devices," *Appl. Phys. Lett.* 2008 92(5), 053307-1-053307-3.

Thompson, B.C. and Fréchet, J.M.J., "Polymer-fullerene composite solar cells," *Angew, Chem. Int. Ed.* 2008, 47, 58-77.

Xu, Z. et al., "Silanation and Stability of of 3-Aminopropyl triethoxy silane on Nanosized Superparamagnetic Particles: I. Direct Silanation," *Applied Surface Science* 1997, 120, 269-278.

Zhang, W. and T. M. Swager, "Functionalization of single-walled carbon nanotubes and fullerenes via a dimethyl acetylenedicarboxylate-4-dimethylaminopyridine zwitterion approach," *J. Am. Chem. Soc.* 2007, 129, 7714-7715.

Zhang, W., et al., "Modular functionalization of carbon nanotubes and fullerenes," J. Am. Chem. Soc. 2009, 131, 8446-8454.

Zheng, L. et al. "Methanofullerenes used as electron acceptors in polymer photovoltaic devices," *J. Phys. Chem. B* 2004, 108, 11921-11926.

\* cited by examiner

FULLERENE-FUNCTIONALIZED PARTICLES, METHODS FOR MAKING THE SAME AND THEIR USE IN BULK-HETEROJUNCTION ORGANIC PHOTOVOLTAIC DEVICES

CROSS-REFERENCE TO RELATED APPLICATIONS

This application claims the benefit of the earlier filing date of U.S. Patent Application No. 61/258,906 filed on Nov. 6, 2009, and U.S. Patent Application No. 61/352,236, filed on Jun. 7, 2010, the contents of which are incorporated by reference herein in their entireties.

FIELD OF THE INVENTION

This application is directed to solar energy. In particular, this application is directed to organic photovoltaic devices and methods for making the same. Conversion of electromagnetic waves covering a range of different energies such as infrared, UV-vis and X-ray, e.g., in photodetectors is addressed.

BACKGROUND

Abundant for most of the year in most parts of the world, solar energy is a renewable zero-emission energy source. Combined with improved means of energy storage, it has the potential to supply a quickly increasing fraction of our energy needs. However, its widespread use for electricity generation requires a significant further decrease in cost and increase in efficiency, difficult to be met by conventional crystalline silicon technology.

SUMMARY

In certain embodiments, a device that includes a transparent electrode, a counter electrode, and an active layer between the transparent anode and the counter electrode is described. In certain embodiments, the active layer includes an electron donating phase and an electron accepting phase that includes a plurality of core particles and an electron accepting material partially or completely covering the core particle. In certain embodiments, the electron donating phase and the electron accepting phase form an interpenetrating network.

In some other embodiments, a device that includes a transparent electrode, a counter electrode, and an active layer between the transparent anode and the counter electrode is described. In certain embodiments, the active layer includes an electron accepting phase and an electron donating phase that includes a plurality of core particles and an electron donating material partially or completely covering the core particle. In certain embodiments, the electron donating phase and the electron accepting phase form an interpenetrating network.

In certain embodiments, the electron accepting material comprises fullerenes.

In certain embodiments, the core particles comprise silica particles.

In certain embodiments, the electron donating phase comprises a conducting polymer.

In certain embodiments, a core-shell particle comprising a core particle and a plurality of fullerenes that partially or completely cover the core particle is described.

In certain embodiments, the core particle comprises silica.

In certain embodiments, a method for forming a core-shell particle is described. The method includes providing a core particle and attaching a plurality of fullerene particles to the core particle to partially or completely cover the core particle.

In certain embodiments, a method for forming a device is described. The method includes forming an interpenetrating network of an electron donating phase and an electron accepting phase, wherein the electron accepting phase comprises a plurality of core particles having at least a partially coated layer of an electron accepting material, and providing the interpenetrating network between a transparent electrode and a counter electrode.

In certain embodiments, a method for forming a device is described. The method includes forming an interpenetrating network of an electron donating phase and an electron accepting phase, wherein the electron donating phase comprises a plurality of core particles having at least a partially coated layer of an electron donating material, and providing the interpenetrating network between a transparent electrode and a counter electrode.

DESCRIPTION OF THE DRAWINGS

The above and other objects and advantages of the present invention will be apparent upon consideration of the following detailed description, taken in conjunction with the accompanying drawings, in which.

DETAILED DESCRIPTION

Allowing for the use of inexpensive, high-speed, large-scale roll-to-roll manufacturing processes, OPV have a significant chance of becoming important technology for electricity generation. However, further improvements in performance and life-time are needed before large-scale implementation can be achieved.

OPV devices, also called polymer-solar cells (PSC) or polymer-fullerene composite solar cells, are lightweight and can be flexible, opening the possibility for a range of new applications including large-area pliable devices. While power conversion efficiencies of up to 8.13% have been reported at a laboratory scale, practical maximum efficiencies between 20 and 25% appear are contemplated.

Without wishing to be bound by theory, in addition to tuning the optical and electronic properties of the materials used for light harvesting, carrier generation, transport, and collection, control of the nanoscale morphology of the active layer can also provide a clear path to power conversion efficiencies of greater than 10%. Particularly, nanoscale morphology may be an important factor in the optimization of OPV.

Bulk heterojunction OPVs are a particular class of OPV device, where a nanoscale morphology between an electron donor polymer and electron accepting material is formed. OPV devices include an electron donor polymer (e.g., poly (3-hexylthiophene) (P3HT)) blended with fullerenes or their derivatives (e.g., [6,6]-phenyl $C_{61}$-butyric acid methyl ester (PCBM)) that function as electron acceptors.

Figure 1:
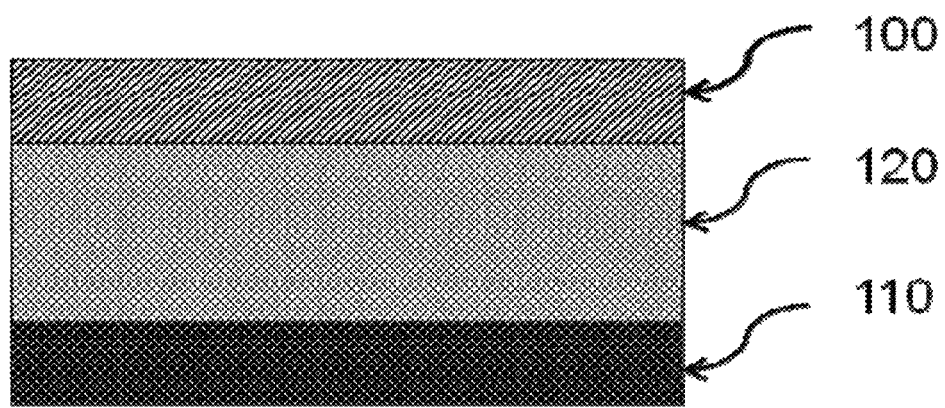
FIG. 1 is a diagram of an organic photovoltaic (OPV) device in accordance with certain embodiments.

As shown in FIG. 1, the OPV device includes a transparent conductive layer (e.g., indium tin oxide electrode (ITO)) 100 serving as the anode and a low work function metal like calcium, aluminum or calcium capped with aluminum 110 serving as the counter electrode. The electrodes sandwich an active layer 120. A hole injection layer placed adjacent to the ITO electrode is not shown in this figure and is consistently omitted in this entire description for clarity.

Figure 2:
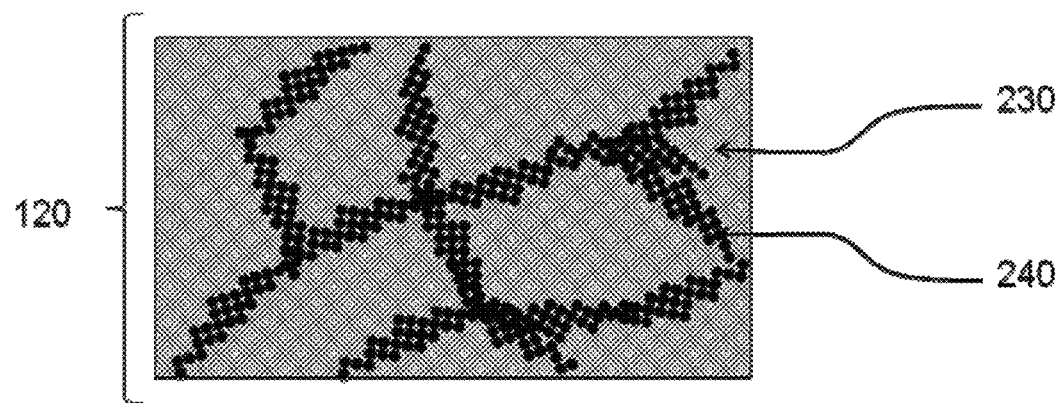
FIG. 2 is a diagram of an active layer of the OPV having electron donor and electron acceptor phases in accordance with certain embodiments.

The active layer in an OPV device depicted in FIG. 2 can be a blend between an electron donor 230 (e.g., conductive polymers like P3HT) and an electron acceptor 240 (e.g., fullerenes or fullerene derivative) forming a network (e.g., bicontinuous or other higher ordered interpenetrating networks).

Some suitable electron donor 230 material include conductive polymers, such as poly(3-hexylthiophene), (poly[2-(3,7-dimethyloctyloxy)-5-methyloxy]-para-phenylene vinylene) (MDMO-PPV), carbazole-based copolymers, cyclopentadithiophene-based copolymers, and small molecules including some liquid crystals (e.g., functionalized hexabenzoncoronene), pentacene derivatives, oligothiophenes, triphenylamines, functionalized anthradithiophenes and a number of traditional low molecular weight colorants, e.g., from the thiophene- and indoline series.

Some suitable electron acceptor 240 materials include fullerenes, such as unfunctionalized or functionalized $C_{60}$, $C_{70}$, $C_{76}$, $C_{78}$, $C_{84}$, $C_{96}$, and larger fullerenes but also other organic molecules such as soluble perylene diimides, e.g., N,N'-dimethyl-3,4,9,10-perylenetetracarboxyldiimides (PTCDI).

An alternative approach includes the use of donor/acceptor dyads where both materials are linked by a covalent bond such as oligo(p-phenylenevinylene)-fullerene (OPV-$C_{60}$) and Zn-phthalocyanine-fullerene (Pc-$C_{60}$).

Figure 3:
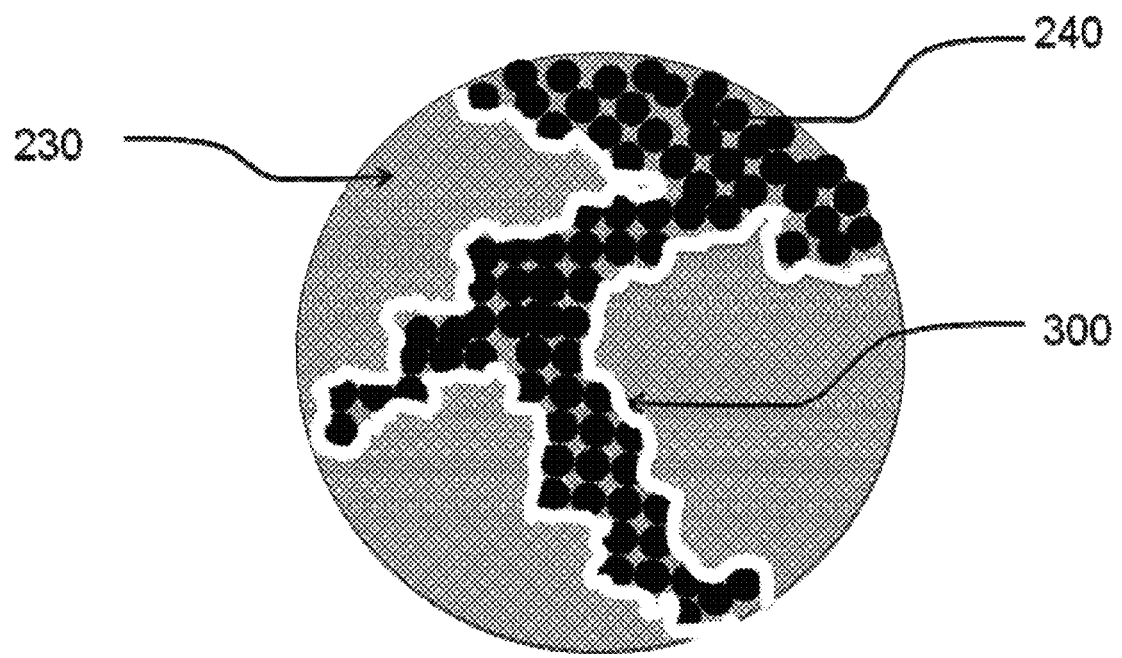
FIG. 3 is a diagram of an active layer of the OPV showing the generation of an electron-hole pair in accordance with certain embodiments.

As shown in FIG. 3, a photon captured in the active layer 120 can generate an electron-hole pair, mostly at the interfacial region 300 between the fullerenes and the polymeric regions. The electron can reach the metal electrode 110 through the conductive network provided by the electron acceptor 240 (e.g., n-type fullerenic molecules). The holes generated in the interfacial region can travel to the transparent indium-tin oxide electrode 100 through the electrical conductive path provided by the electron donor 230 (e.g., p-type conductive polymers).

Accordingly, the bulk heterojunction can be an interpenetrating networks of the p-type and n-type materials, wherein each electron donor 230 and electron acceptor 240 is electrically connected to its respective electrode. Without wishing to be bound by theory, such interconnected network may be beneficial in minimizing dead-ends, inclusions or any similar barriers to maximize photovoltaic efficiencies. (See H. Hoppe and N. S. Sariciftci, Morphology of polymer/fullerene bulk heterojunction solar cells. *J. Mater. Chem.* 2006, 16, 45-61; and B. C. Thompson and J. M. J. Fréchet, Polymer-fullerene composite solar cells. *Angew, Chem. Int. Ed.* 2008, 47, 58-77, the contents of which are incorporated by reference herein in their entireties.)

Moreover, as noted earlier, an interpenetrating network at the nanoscale is generally desired. Accordingly, macroscopic phase separation of the p-type material and the n-type materials, on lengths scale much greater than nanometers, is undesirable. On the other hand, complete dissolution of the n-type material with the p-type material is also undesirable. Generally, OPVs formed using fullerenes and conducting polymers tend to suffer from macroscopic phase separation.

Accordingly, to enhance the solubility and their dispersion of the unfunctionalized fullerenes (such as $C_{60}$, $C_{70}$, and $C_{84}$) in their p-type counterpart, the fullerenes can be chemically functionalized. Some of the well known organic derivatives of fullerenic molecules are 6,6-phenyl-$C_{61}$-butyric acid methyl ester (PCBM), 6,6 phenyl-$C_{61}$-butyric acid butyl ester (PCBB), and the like.

Introduction of the functional groups can modify the electronic properties of the fullerenes. The electronic properties can be modified by attaching electron withdrawing or electron donating groups, and in so doing, it may be possible to further improve the photovoltaic efficiency.

Throughout this application, the term "fullerenic molecules" will refer to both unfunctionalized fullerenes and chemically functionalized derivatives.

In addition to improving the solubility of the fullerenes and their dispersibility, functionalization of the fullerenes can lead to certain nanoscale morphologies, which can play an important role in bulk heterojunction OPV device performance.

For example, the morphology of the bulk heterojunction can be affected by steric factors like orientation and spacing of the unfunctionalized or functionalized (or derivatized) fullerene molecules with respect to the conformation of the p-type polymeric chains as well among themselves. Particularly, separation between the n-type and the p-type, or alternatively between each n-type unit may be important in that electrons move from the p-type to the n-type and within the n-type by a "hopping" mechanism. As such, certain preferred spacing and separation between the electron donor and electron acceptor regions can be about less than about 5, 10, 15, or 20 nm. The degree of separation may be one factor in impacting device performance. (See L. Zheng, Q. Zhou, X. Deng, M. Yuan, G. Yu and Y. Cao, Methanofullerenes used as electron acceptors in polymer photovoltaic devices. *J. Phys. Chem. B* 2004, 108, 11921-11926; and M. Lenes, G.-J. A. H. Wetzelaer, F. B. Kooistra, S. C. Veenstra, J. C. Hummelen and P. W. M. Blom, Fullerene bisadducts for enhanced open-circuit voltages and efficiencies in polymer solar cells. *Adv. Mater.* 2008, 20, 2116-2119, the contents of which are incorporated by reference herein in their entireties.).

Accordingly, maintaining a larger interfacial area of contact 300 between the p and n type materials and at the same time retaining the continuous conductive network of p-type and n-type may be an important part of improving OPV efficiencies.

Addition of a "core" particle to a bulk heterojunction (BHJ) active layer to further improve OPV efficiencies is discussed. In particular, "core particle"-fullerenic molecules hybrids, where fullerenes or fullerenic derivatives form a shell on the outer, geometric surface of a core particle, is described. Methods of their manufacture are also described. Depending on the particular fullerenic molecule utilized and any particular functionalization (e.g., electron-donor and acceptor materials), preferential interaction of the fullerenic molecules with the polymer material can also be utilized to achieve improved morphology and, finally, performance of the OPV devices.

Such core-shell nanoparticles can be dispersed homogeneously in donor organic polymers like P3HT to form bulk heterojunction photovoltaic devices. The solid spherical core particles can provide for the uniform, three dimensional dispersion of the fullerenes and a larger interfacial area for the photoactive regions. The spherical core of the core-shell nanoparticle can also enhance the conductivity.

The size (diameter) of the core particle can be adjusted in order to achieve optimized scattering allowing for improved photon collection efficiencies in given regions of the electromagnetic spectrum.

The concept of adding inorganic material including inorganic fullerenic hybrids can be extended beyond conventional bulk heterojunction cells to alternative approaches such as tandem cells.

Core Shell Particles (CSP)

Core shell particles (CSP) can include any core particles having a shell of a second material or second phase. The diameter of the CSPs can range from approximately ten nanometers to few microns.

In certain embodiments, the second material surrounding the core particle can be a electron donating material. Alternatively, the second material surrounding the core particle can be a electron accepting material.

In certain embodiments, the core-shell configuration can take advantage of the spherical size and size uniformity of the core particle in providing isotropic particle-particle interactions in stable dispersions. This property can simplify the control of the rheology of the dispersions and the morphology of thin films of CSP dispersions.

In certain embodiments, the shell material may cover the core particles at a sufficient extent to form a continuous pathway around each core particle. Degrees of suitable exemplary surface coverage can include 25%, 30%, 40%, 50%, 60%, 70%, 80%, 90%, or even close to 100% of the core particle's surface.

In certain embodiments, the core and the shell material can be formed using any kind of desired interactions, such as, and not limited to, van der Waals interactions, covalent interactions, ionic interactions, and the like.

Core Particles

In certain embodiments, the core particles can be a ceramic, metal, semiconductor or a polymer. For example, inorganic core particles can be composed of alumina, germania, titania, zirconia, zinc oxide, iron oxide, nickel oxide, cobalt oxide, calcium oxide, beryllium oxide, magnesium oxide, manganese oxide, tin oxide, and the like including other oxides, carbides, borides, nitrides, and silicides. Metals can include iron, cobalt, aluminum, and the like. However, the metal core particle may be surrounded an insulating or semiconducting phase before they are functionalized with the fullerene particles. Polymers can include polyethylene, polystyrene and latex. Semiconductors can include silicon, germanium, and the like.

In other embodiments, the core particle can be monodisperse in size. In some other embodiments, the core particles can have any desirable shapes, such as spherical, oblong, prismatic, ellipsoidal, irregular, or any desired shapes.

As a non-limiting example of the core particles, Stober's silica microspheres can be utilized. Stober's silica microspheres can be formed by the base-catalyzed hydrolysis of silicon alkoxides also known as tetra-alkyl orthosilicates. The hydrolysis can result in the formation of perfectly spherical silica particles. The mean diameter and narrow size dispersity of the silica particles are controlled by various factors like concentrations, temperature and duration of the reaction. (See, e.g., S. Ramesh, Y. Cohen, R. Prozorov, K. V. P. M. Shafi, D. Aurbach, and A. Gedanken, Organized Silica Microspheres Carrying Ferromagnetic Cobalt Nanoparticles as a Basis for Tip Arrays in Magnetic Force Microscopy. *J. Phys. Chem. B* 1998, 102, 10234-10242, or S. V. Patwardhan, N. Mukherjee and S. J. Clarson, Effect of Process Parameters on the Polymer Mediated Synthesis of Silica at Neutral pH. *Silicon Chemistry* 2002, 1, 47-55, and references therein).

Figure 4:
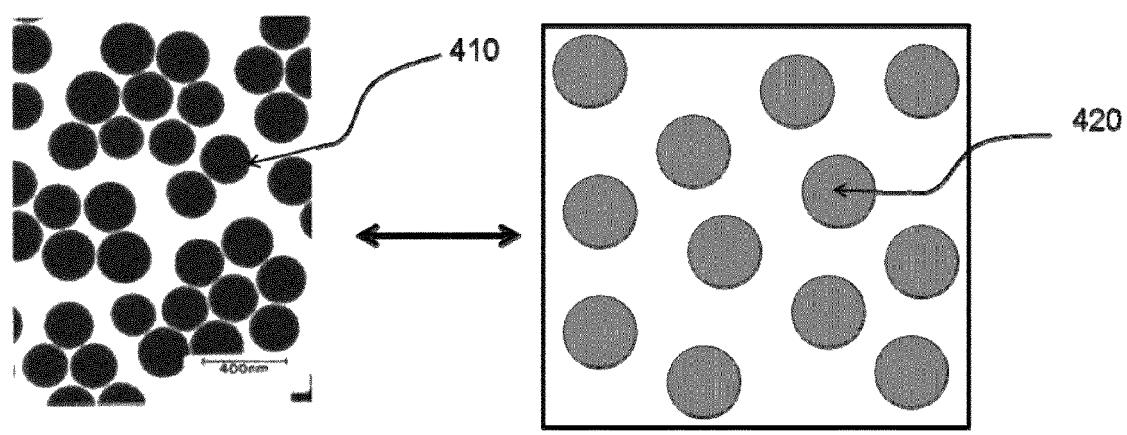
FIG. 4 is a TEM micrograph and a diagram of silica microspheres in accordance with certain embodiments.

A TEM micrograph of a typical Stober silica microspheres 410 is shown in FIG. 4. The spherical particles 410 are also represented schematically as 420. The particles can be synthesized in a wide range of diameters of few nanometers to few hundred nanometers with narrow size dispersity. Suitable core particle sizes can be, for example, 10 nm, 20 nm, 30 nm, or even larger.

Figure 5:
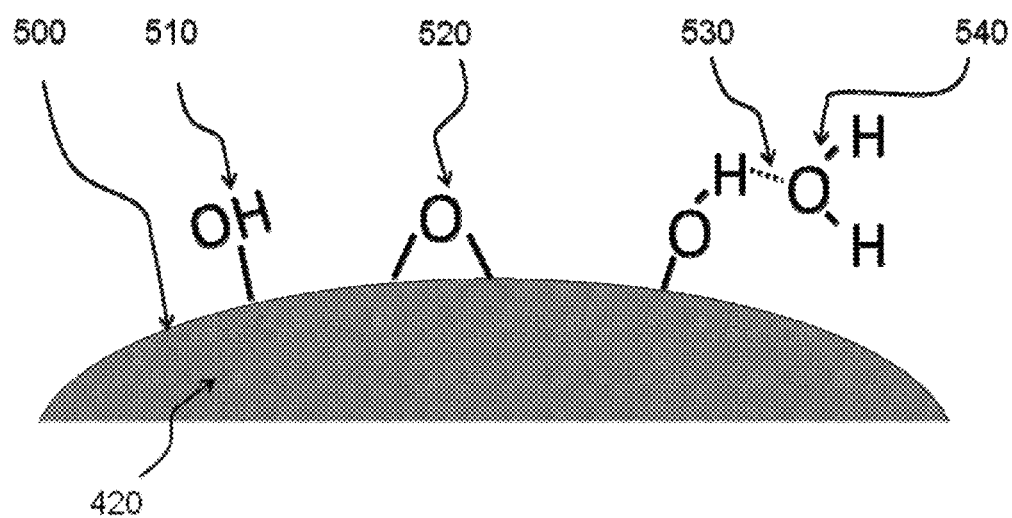
FIG. 5 is a diagram of a silica sphere having surface chemical species in accordance with certain embodiments.

Inorganic particles, such as the silica particle 420 shown in FIG. 5, can host a significant concentration of surface chemical species. For example, the surface of the silica microsphere 500 hosts hydroxyl groups or silanol groups 510 that can be used for the organic derivatization of silica particles. The surface can also hosts siloxane groups 520 and hydrogen bonded 530 water molecules 540 that are chemically bound to the silica surface.

Moreover, the inorganic particles can further be modified to impart other chemical functionalities, as would be readily apparently to one of ordinary skill in the art, e.g., by reaction under reflux in water or organic solvent reagents such as 3-aminopropyl triethoxy silane (see, e.g., Z. Xu, Q. Liu and J. A. Finch, Silanation and Stability of 3-Aminopropyl triethoxy silane on Nanosized Superparamagnetic Particles: I. Direct Silanation. *Applied Surface Science* 1997, 120, 269-278.). Some non-limiting examples of chemical functionalities that may appear natively, or those that can be prepared on inorganic surfaces, include functional groups, such as —OH, —COOH, —NH$_2$, ether, ester, amide, —Cl, —Br, and the like.

Shell

In certain embodiments, the shell can be metal, ceramic, polymer or small organic molecules. In some other embodiments, the shell can include monodisperse particles that are smaller than the size of the core particles. In addition to or instead of fullerenes and their derivatives, other organic n-type material such as perylene diimides or donor/acceptor dyads can be attached to the core particles.

In certain embodiments, the shell can be made using fullerenic molecules, such as unfunctionalized or functionalized $C_{60}$, $C_{70}$, $C_{76}$, $C_{78}$, $C_{84}$, $C_{96}$, and the like. Larger fullerenes are within the scope of the invention. Particular examples of suitable fullerenic molecules include $C_{60}$-PCBM, $C_{60}$-PCBB, $C_{60}$-indene (A. Puplovskis, J. Kacens and O. Neilands, New Route for [60]Fullerene Functionalization in [4+2] Cycloaddition Reaction Using Indene. *Tetrahedron Lett.* 1997, 38, 285-288.), $C_{60}$-o-quinodimethane (P. Belik, A. Gügel, J. Spickermann and K. Müllen, Reaction of Buckminsterfullerene with ortho-Quinodimethane: a New Access to Stable $C_{60}$ Derivatives. *Angew. Chem. Int. Ed. Engl.* 1993, 32, 78-80.), products of the dimethyl acetylenedicarboxylate-4-dimethylaminopyridine zwitterion approach (W. Zhang, J. K. Sprafke, M. Ma, E. Y. Tsui, S. A. Sydlik, G. C. Rutledge and T. M. Swager, Modular functionalization of carbon nanotubes and fullerenes. *J. Am. Chem. Soc.* 2009, 131, 8446-8454.) but also multiple adducts and functionalized side groups, and the like.

Inorganic Core-Fullerenic Shell CSP

As one non-limiting example of CSP, CSPs with an inorganic or ceramic core and fullerenic molecule shell are referred to in this description as Inorganic Core-Fullerenic Shell (IC-FS) nanoparticles. However, it should be understood that the certain characteristics describing IC-FS can equally be applied to CSP interchangeably throughout this specification.

Figure 6:
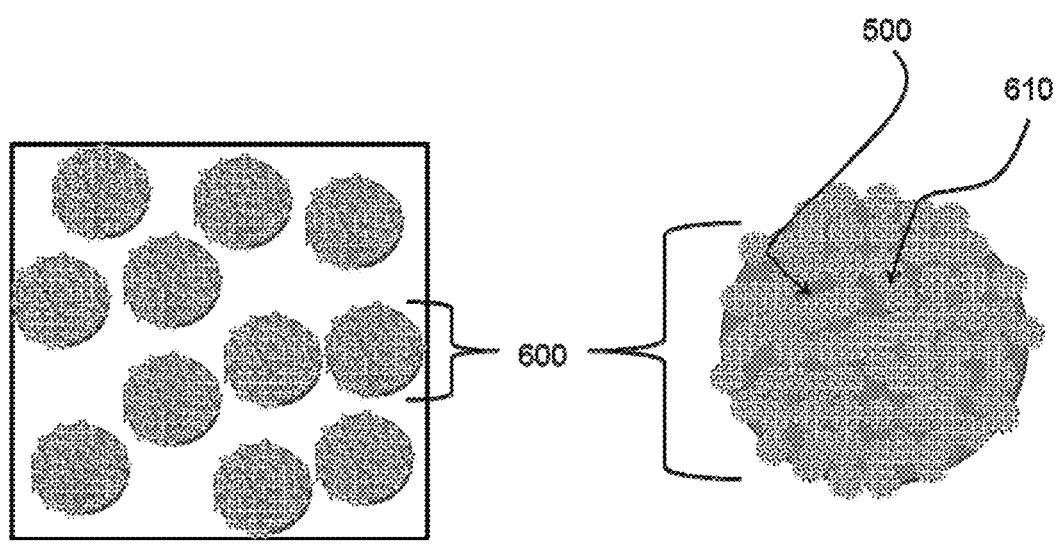
FIG. 6 is a diagram of a core-shell particle (CSP) having an inorganic core (IC) and a fullerenic shell (FS) in accordance with certain embodiments.

A schematic view of the IC-FS nanoparticles is shown in FIG. 6. Fullerenic particles can be deposited on the surface of Stober silica particle 500 to form a CSP as shown in 600. A zoom-in view of a single silica particle coated with fullerenic molecules 610 is also shown in FIG. 6. As shown, the fullerenic molecules can form a dense monolayer or multilayer on the surface of the silica spheres providing continuously connected dense network of fullerenes.

Functionalized or non-functionalized fullerenic molecules can be anchored on to the silica surface by means of covalent bonds, hydrogen bonds or van der Waals forces of interaction.

Figure 7:
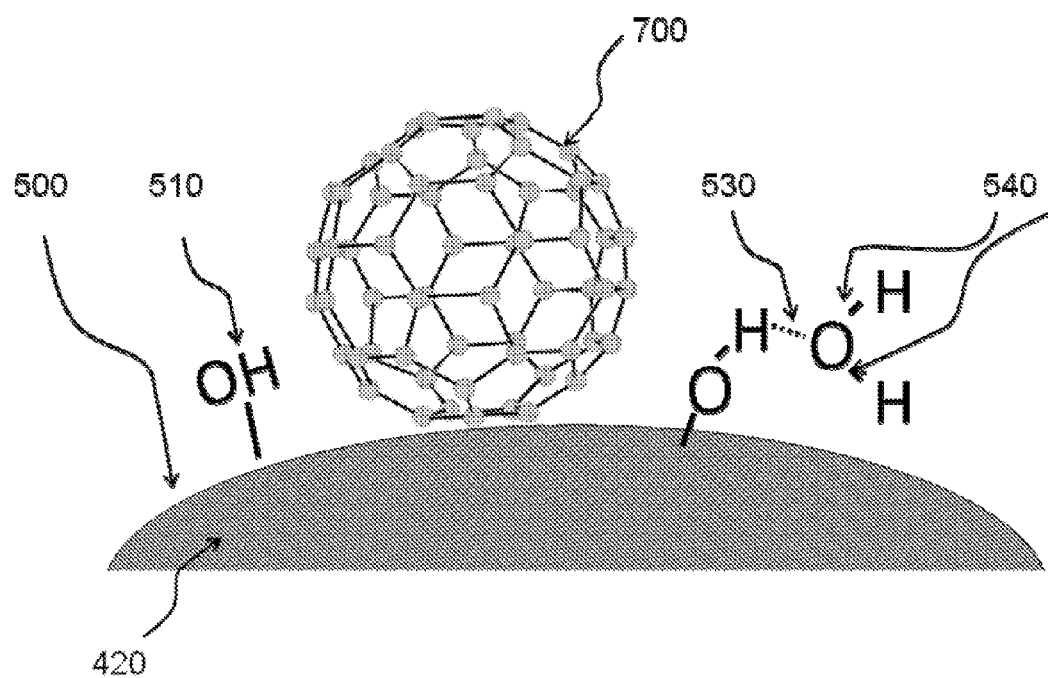
FIG. 7 is a diagram of an IC-FS CSP where the fullerenes (or fullerene derivatives) interact with the IC through van der Waals interactions in accordance with certain embodiments.

In certain embodiments, the silica surface-fullerenic molecule interaction in an IC-FS can be a van der Waals adhesion to the pristine surface of the silica core. FIG. 7 schematically illustrates such van der Waals interaction with an underivatized $C_{60}$ molecule 700. Other fullerenic molecules are within the scope of the invention. For example, the non-functionalized fullerenic molecules can be $C_{60}$, $C_{70}$, $C_{76}$, $C_{78}$, $C_{84}$, larger fullerenes ($C_n$ with $C_{84}<n<5000$), short well-defined single-walled carbon nanotubes, and mixtures between two or more of the above.

Figure 8:
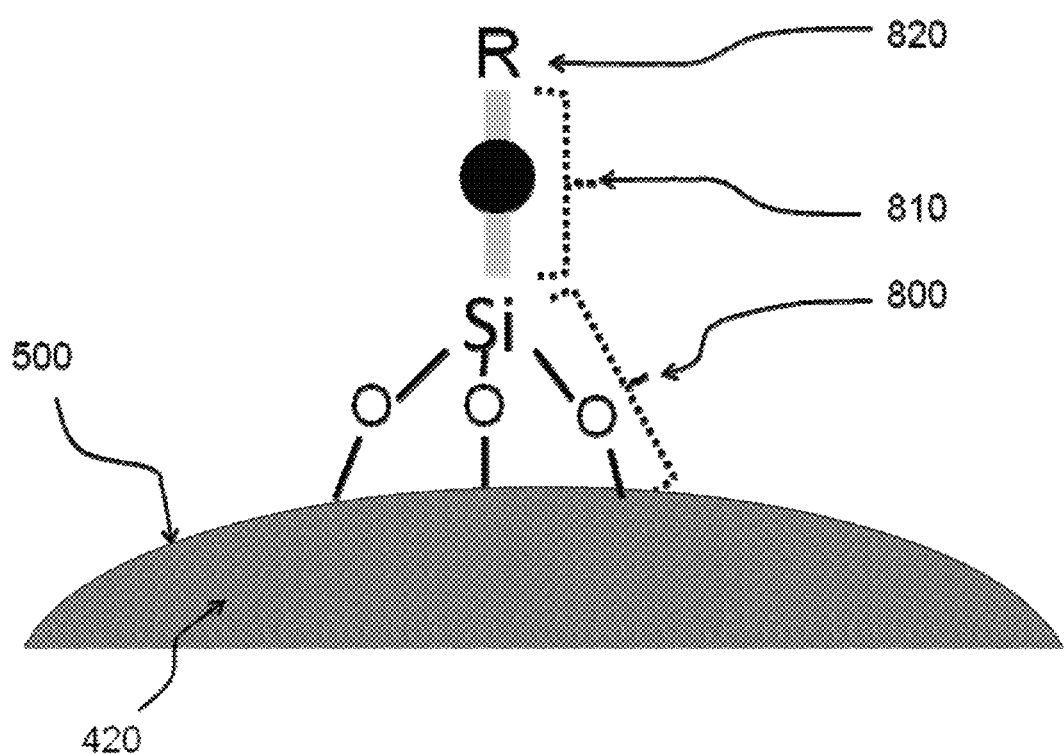
FIG. 8 is a diagram of an IC-FS CSP where the fullerenes (or fullerene derivatives) interact with the IC through covalent interactions in accordance with certain embodiments.

In some other embodiments, the surface chemistry of the core silica and/or the fullerenic molecules can be tailored to tether the fullerenic molecules onto the core silica particle through a covalent bonding. As shown in FIG. 8, the silica core having one or more functional groups 800 can be covalently linked to a functional group R 820 on the fullerenic molecule through a link moiety 810. The link moiety 810 can be a simple alkyl chain or a more complex molecule.

As a non-limiting example, FIG. 8 shows Stober silica particle derivatized by silylation. Other non-limiting examples of chemical functionalities that may appear natively, or that can be prepared on the silica core particle surfaces, include functional groups, such as —OH, —COOH, —NH₂, ether, ester, amide, —Cl, —Br, and the like.

In certain embodiments, the link moiety 810 can be specifically designed to alter the electronic structure of the fullerenic molecule for optimized interaction with the p-type donor polymers. In some other embodiments, the silica surface can be organically terminated with functional groups that are positively or negatively electron inductive towards the fullerenic moiety.

The electronic structure of the fullerenic molecules can also be modified by chemical derivatization with one or more of organic functional groups of similar or different types. By choosing electron-withdrawing or electron-donating groups, electronic properties such as the LUMO level and absorption characteristics can be adjusted for optimized performance of the resulting bulk heterojunction cells. (See F. B. Kooistra, J. Knol, F. Kastenberg, L. M. Popescu, W. J. H. Verhees, J. M. Kroon and J. C. Hummelen, Increasing the open circuit voltage of bulk heterojunction solar cells by raising the LUMO level of the acceptor, *Org. Lett.* 2007, 9, 551-554, the contents of which is incorporated by reference herein in its entirety).

For example, fullerenic molecules can be functionalized by large range of chemistries such as malonic ester ester addition (see C. Bingel, Cyclopropanierung von fullerenen. *Chem. Ber.* 1993, 126, 1957-1959, the contents of which is incorporated by reference herein in its entirety), hydroxylation (see L. Y. Chiang, J. W. Swirczewski, C. S. Hsu, S. K. Chowdhury, S. Cameron and K. Creegan, Multi-hydroxy additions onto $C_{60}$ fullerene molecules. *J. Chem. Soc., Chem. Commun.* 1992, 1791-1793, the contents of which is incorporated by reference herein in its entirety) or cycloaddition reactions leading to molecules of the PCBM (6,6-phenyl, $C_{61}$-butyric acid methyl ester) family (see J. C. Hummelen, B. W. Knight, F. LePeq and F. Wudl, J. Yao and C. Wilkens, Preparation and characterization of fulleroid and methanofullerene derivatives. *J. Org. Chem.* 1995, 60, 532-538 and F. B. Kooistra, J. Knol, F. Kastenberg, L. M. Popescu, W. J. H. Verhees, J. M. Kroon and J. C. Hummelen, Increasing the open circuit voltage of bulk heterojunction solar cells by raising the LUMO level of the acceptor, *Org. Lett.* 2007, 9, 551-554, the contents of which are incorporated by reference herein in their entireties). Other functionalization techniques can include Diels-Alder reactions (see A. Puplovskis, J. Kacens and O. Neilands, New route for [60]fullerene functionalization in [4+2] cycloaddition reaction using indene. *Tetrahedron Lett.* 1997, 38, 285-288, the contents of which is incorporated by reference herein in its entirety) or a zwitterion approach (see W. Zhang and T. M. Swager, Functionalization of single-walled carbon nanotubes and fullerenes via a dimethyl acetylenedicarboxylate-4-dimethylaminopyridine zwitterion approach. *J. Am. Chem. Soc.* 2007, 129, 7714-7715, the contents of which is incorporated by reference herein in its entirety).

In certain embodiments, subsequent to or simultaneous with the functionalization of the fullerene cage, additional chemical groups such as —OH, —SH, —COOH, —NH₂, —CONH₂ can be bound to the fullerenic molecule or the functional group for even further functionalization with similar or different moieties.

Once the desired functional groups have been formed on the fullerenic molecules and/or the silica core particles, covalent bonds such as ethers, esters or amides can be formed under suitable reaction conditions.

Figure 9:
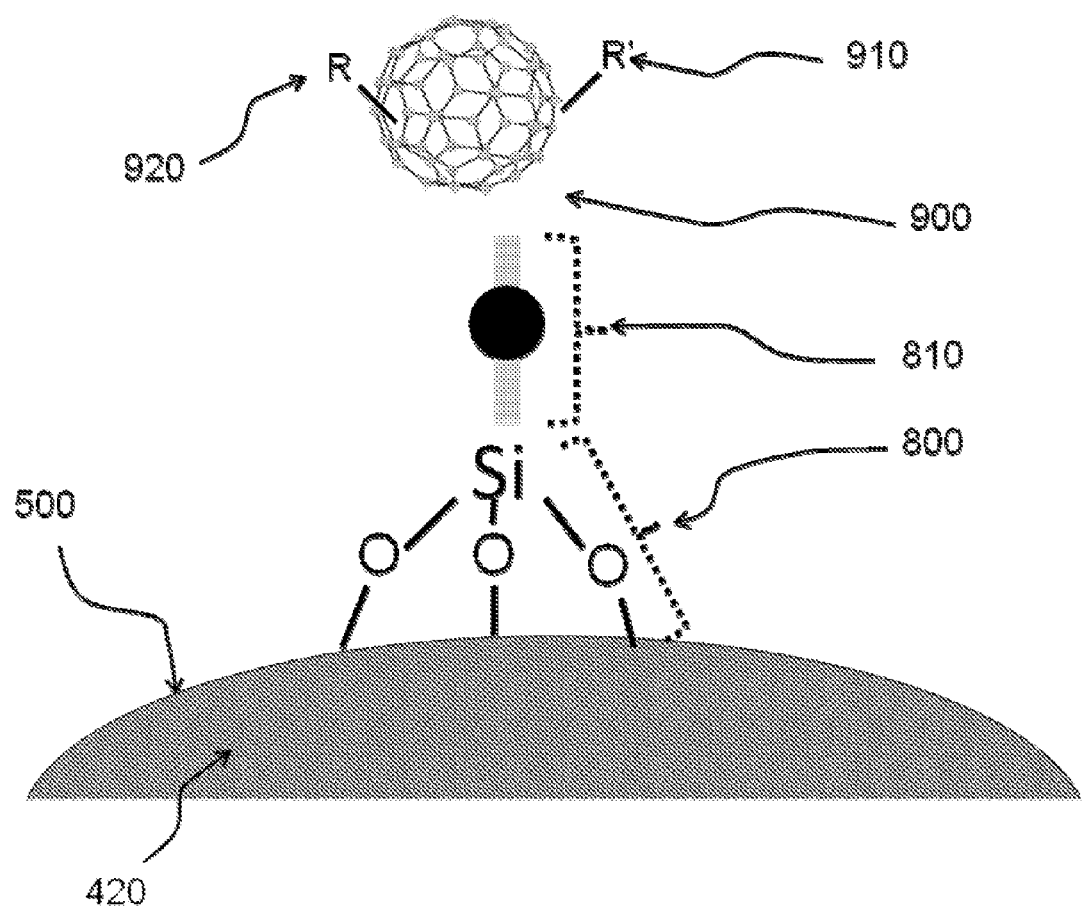
FIG. 9 is a diagram of an IC-FS CSP where the fullerenes have two or more same or different functional groups in accordance with certain embodiments.

FIG. 9 shows one exemplary embodiment where organically modified $C_{60}$ 900 can be functionalized with two same or different functional groups R' 910 and R 920. The core particle 420 can contain on its surface 500 SiO$_x$ groups 800, where a link moiety 810 can induce adsorption of the organically modified $C_{60}$ 900 to the core particle 420.

In an alternative embodiment, the link moiety 810 can induce functionalization of the core particles to exhibit functional groups, where the functional groups covalently bind to the link moiety 810 and the link moiety 810 further covalently binds to one or more of the functional groups R' 910 and R 920, leading to a covalently bound fullerene molecule on the core particle surface.

For example, functionalization can be conducted using a commercially available toluene solution of —OH-bearing silica spheres. Reaction with fullerenes (e.g., PCBM) can be conducted in suitable solvents, (e.g., o-dichlorobenzene) under suitable conditions. For example, the reactions conditions can be chosen at elevated temperatures using inert gases so that higher concentrations of the reactants and therefore reaction rates can be utilized. Once the reaction is completed, purification can carried out (e.g., using chromatography), that can separate unreacted PCBM with those that are bound to the core particle.

Additional modifications and/or improvements are within the scope of the present application. For example, improved chromatographic purification using a sequence of eluents and eluent mixtures can provide higher purity and a narrower distribution of the extent of coverage on the silica sphere surface.

Synthesis conditions such as the concentrations of the reactants, temperature and reaction time can be changed in order to control the degree of functionalization.

Assisted by semi-empirical quantum chemical computations of electronic structures, particularly of LUMO and HOMO levels, alternative functionalizations, allowing for instance for a higher open-circuit voltage ($V_{oc}$) in combination with a given p-phase, can be investigated.

As described above, a PCBM having multiple functionality can be utilized. For example, a first functional group can be attached, that is used to attach fullerene molecules covalently to the silica. A second functional groups inert to subsequent reaction in presence of PCBM or Si—OH, such as o-quinodimethane, indene or some groups obtained with the modular "Zwitterion" approach, can also be attached. These additional functional groups can affect the electrical properties of the PCBM materials.

Resulting functionalized silica spheres can be further characterized using TGA, UV-vis and IR-spectroscopy, transmission electron microscopy (TEM) and X-ray diffraction (XRD). XRD can allow determination of the degree of crystallinity of the fullerenes and its derivatives.

While attachment of the fullerenes to the silicon sphere is not expected to affect their electronic properties, cyclo-voltametry (CV) combined with UV-vis spectroscopy can allow for comparison with unattached functionalized fullerenes.

Additionally, $C_{70}$ equivalents of the covalently bonded fullerene-derivative-silica compounds (i.e., IC-FS) can also be prepared. Other higher fullerenes are also within the scope of the invention.

Bulk Heterojunction OPV

The CSP described herein can be useful for numerous different applications. In particular, the CSP described herein can be utilized to form highly efficient bulk heterojunction OPV that provide improved device performance.

As discussed above, CSP can include a core particle with a shell of an electron donating material. In such embodiments, the OPV device can be fabricated by mixing the CSP with an electron accepting material to form an interpenetrating network between the CSP and the electron accepting material.

In some other embodiments, CSP can include a core particle with a shell of an electron accepting material. If such embodiments, the OPV device can be fabricated by mixing the CSP with an electron donating material to form an interpenetrating network between the CSP and the electron donating material.

Figure 10:
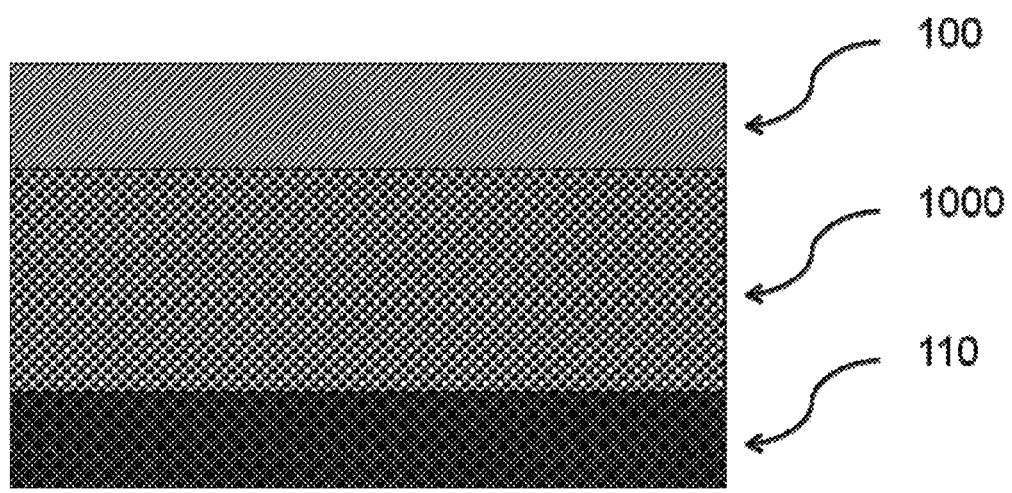
FIG. 10 is a diagram of an OPV device utilizing IC-FS CSP in the active layer in accordance with certain embodiments.

A non-limiting schematic view of a bulk heterojunction device employing IC-FS described above is shown in FIG. 10. The device can include a transparent conductive indium tin oxide electrode (ITO) 100 serving as the anode and a low work function metal like calcium or aluminum 110 serving as counter electrode. The electrodes sandwich an active phase 1000, which can include the IC-FS described above and a suitable electron donor material.

Figure 11:
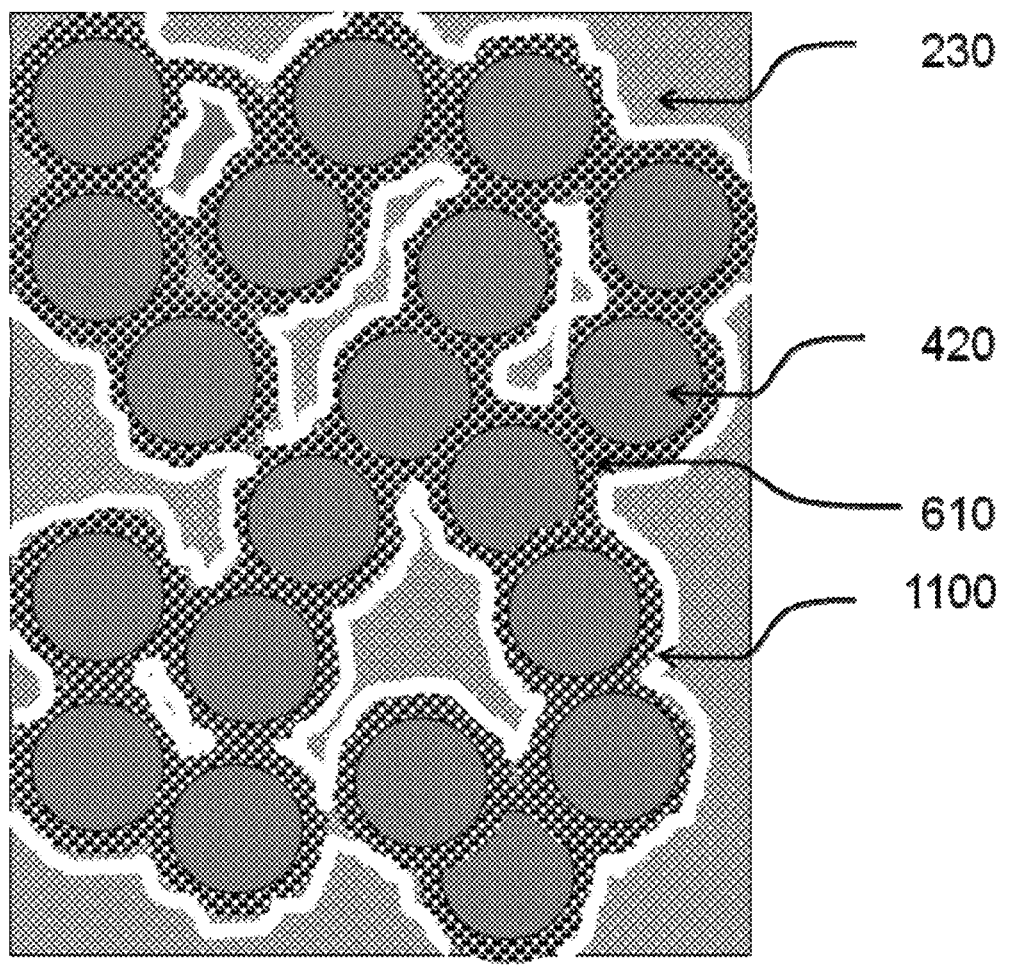
FIG. 11 is a cross-section view of the active layer of FIG. 10 having IC-FS CSP in accordance with certain embodiments.

The cross section of the active phase 1000 shown schematically in FIG. 11. As shown, active phase 1000 includes a conducting polymer 230 and IC-FSs (420 and 610), where a photon captured in the active layer generates an electron hole pair, mostly at the interfacial area 1100. The electrons are conducted to the metal electrode through the dense fullerenic network 610, whereas the holes travel to the ITO electrode 100 through the interpenetrating network of the polymeric phase 230. It should be noted that although the polymer phase 230 does not look continuous, the image is a two-dimensional slice of an interpenetrating network and may appear discontinuous. However, the polymeric phase 230 forms a continuous interpenetrating network with the IC-FSs (420 and 610) in three-dimensions.

Bulk heterojunction OPV described herein have numerous advantages over bulk heterojunction OPV that utilize fullerenes without the CSPs. Comparing the interfacial area 1100 in FIG. 11 to interfacial area 300 in FIG. 3, the interfacial area between the conducting polymers and the fullerenes is significantly increased. Without wishing to be bound by theory, such increase in the interfacial area between the electron donating and electron accepting phases may provide improved efficiencies.

In addition, bulk heterojunction OPV described herein can provide improved light conversion efficiencies. Bulk heterojunction OPV that use fullerenes without using CSP generally transmit significant amount of photons and a high number of photons simply pass through the bulk heterojunction OPV without being converted into electricity. In contrast, bulk heterojunction OPV that use CSP can allow more photons to convert into electricity. Without wishing to be bound by theory, the presence of the core-shell particles within the interpenetrating network of the electron acceptor phase can lead to scattering of the light within the bulk heterojunction OPV allowing more photons to interact with the materials before passing through or exiting the active region 1100, which can allow more photons to be converted into electricity.

Moreover, bulk heterojunction OPV that use fullerenes without using CSP are limited to formation of thin films. The thickness limitation arises because the conducting polymers generally have low electron mobilities. Accordingly, if thickness increases, conversion efficiency suffers due to the mobility driven thickness limitations of the polymeric phase.

In contrast, bulk heterojunction OPV that use CSP can be made into thick films because the effective thickness of the interfacial region is defined by the packing density of the IC-FS particles and is independent of the film thickness itself. In other words, increasing the thickness does not lead to mobility driven limitations of bulk heterojunction OPVs that do not employ CSP because in the bulk heterojunction OPV that utilize CSP, the interfacial region is not dependent on the thickness of the film itself, but only by how the IC-FS particles pack together between the conducting polymer. Accordingly, the thicker films employing the IC-FS particles, effectively functioning as clusters, can provide for scattering within the active layer and can provide an additional mechanism in which even greater number of photons can result in the electron-hole separation process. As such, contrary to conventional wisdom, increasing thickness can lead to improved efficiencies.

Bulk heterojunction OPV described herein can be fabricated in any number of ways. For example, the active layer can be formed by depositing IC-FSs on to a substrate having a suitable electrode on to which a donor polymer such as poly(3-hexylthiophene) (P3HT) can be overlaid. IC-FSs and P3HT can also be blended together in a common dispersing/dissolving solvent and cast into thin films on substrates having a suitable electrode. Some non-limiting methods for forming the active layer include spin coating, static coating, extrusion, and the like, as would be readily apparent to one of ordinary skill in the art. Other desired features of the bulk heterojunction OPV, particularly the formation of an interpenetrating network or a gradual change of the p- to n-phase ratio can further be formed, as would be readily apparent to one of ordinary skill in the art.

In certain embodiments, the fabrication process described above can be optimized to provide electron donating phases (e.g., conducting donor polymer P3HT) and electron accepting phases (e.g., IC-FS) that have domain sizes that are less than about 20 nm in size (e.g., less than 20 nm, 15 nm, 10 nm, 5 nm, etc.). Such domain sizes may be obtained by optimizing processing conditions, such as solvent, evaporation rate of solvent (e.g., water, alcohol, chloroform, halogenated solvents, toluene, benzene, dichlorobenzene, mixtures thereof, etc.), boiling point of solvent, solubility of IC-FS and/or conducting polymer in the desired solvent, molecular weight of the conducting polymer, choice of functional groups on the conducting polymer and/or IC-FS, deposition temperature, and the like.

Without wishing to be bound by theory, the use of IC-FS CSP can provide superior results for at least the following three reasons: (1) a higher degree of photon absorption can be enabled by increase light scattering within the active layer, leading to longer pathlengths within active layer; (2) a greater interfacial area between the electron donors and acceptors to improve efficient exciton dissociation; and (3) discrete and highly interconnected pathways that can lead to high electron and hole mobility. These resulting benefits may allow for thicker active layers, which can provide even further benefits in greater absorption due to a larger amount of the active layer material and even further enhanced scattering/pathlengths within the active layer.

Further enhancements, such as optimization of electron donor and acceptor electronic structures, allowing for more efficient light absorption and higher voltages can be carried out. For example, voltage can be further increase by increasing the bandgap between the HOMO level of the electron donor and the LUMO level of the electron acceptor.

Moreover, suitable chemical functionalization can provide less negative LUMO levels, and therefore, higher voltages. Examples include zwitter ions containing electron-donating heteroatoms and multiple functionalization interrupting the conjugated electron system. However, care should be taken in chemical functionalization as multiple functionalization can decrease the short circuit current (i.e., the largest current that can be drawn from the OPV device). Accordingly, despite the further increase in the open circuit voltage, overall device performance can be lowered.

Device Fabrication

Bulk heterojunction active layers (e.g., consisting of [6,6]-phenyl-$C_{61}$-butyric acid methyl ester (PCBM) as n-phase and poly(3-hexylthiophene) (P3HT) as electron donor (p-phase)) can be prepared as a benchmarking system. PCBM-P3HT systems have been studied by many investigators and relatively detailed morphologic information is available. An exemplary device fabrication procedure is available in Reese et. al. "Optimal negative electrodes for poly(3-hexylthiophene):[6,6]-phenyl C61-butyric acid methyl ester bulk heterojunction photovoltaic devices," *Appl. Phys. Lett.* 2008 92(5), 053307-13.

Briefly, patterned indium tin oxide (ITO) substrates are first mechanically cleaned and sonicated sequentially in acetone and isopropyl alcohol, before being blown dry with $N_2$. The substrates are then exposed to an oxygen plasma. Next, a hole injection layer of poly(3,4-ethylenedioxythiophene)poly(styrenesulfonate) (PEDOT:PSS, Baytron P VP AI 4083, filtered at 0.45 μm) is spin coated twice and baked on a hotplate at 120° C. for 1 h. The sample is then transferred to a glovebox for all subsequent deposition and characterization steps.

Typically, the active layers are prepared from 1:1 blends of poly(3-hexlythiophene) (P3HT) and [6,6]-phenyl $C_{61}$-butyric acid methyl ester (PCBM) dissolved in o-dichlorobenzene. The solutions are stirred on a hotplate at 60° C. for at least 24 hours prior to deposition. The active layer is deposited by spin coating to achieve the optimal active layer thickness of 250-300 nm. Each sample is placed in a covered petri dish for at least 1 h to slowly dry, enhancing the film morphology. After drying, the samples are baked at 110° C. for 10 min before being transferred to the evaporation chamber. Twenty (20) nm of Ca and 100 nm of Al are then thermally evaporated to form the back contact.

Devices can similarly be fabricated from the covalently bonded fullerene derivative/silica compounds (IC-FS) or fullerene derivative/silica sphere mixtures using standard protocols, and compared to the P3HT-PCBM baseline. Deposition procedures such as the solvent system (e.g., toluene or o-dichlorobenzene) including the use of additives such as alkanedithiols or 1,8-diiodooctane and annealing temperatures can be optimized.

The use of p-phases other than P3HT, particularly of new low band gap polymers such as (PCPDTBT), poly(2,7-carbazole) derivatives or PTB1 are also possible.

Testing the Devices

Devices can be measured with a solar simulator using a tungsten halogen bulb (ELH) to provide 100 mW/cm$^2$, two Hamamatsu S1787-04 Si reference diodes to monitor intensity, and an Ocean Optics USB4000 spectrometer to determine the spectral mismatch.

Characterization of Devices

In addition to the characterization of n-phase material, properties of resulting devices can be studied in detail. Morphology can be investigated in detail using AFM, TEM, photoconductive atomic force microscopy (pcAFM) or time-resolved electrostatic force microscopy (trEFM). Quantum efficiencies and charge carrier mobilities can be determined.

EXAMPLES

Example 1

OPV performance of non-covalently bonded mixtures between [6,6]-phenyl-$C_{61}$-butyric acid methyl ester (PCBM) and —OH-bearing silica spheres with average diameters of 10 to 15 nm combined with P3HT have been investigated.

The silica spheres are commercially available from Nissan Chemical (www.nissanchem-usa.com/organosilicasol.php) and were rendered soluble in toluene by the limited —OH functionalization. PCBM synthesized by Nano-C, Inc. and commercially available, was used. P3HT was purchased from Rieke Metals Inc. or Plextronics.

Active layers were deposited by means of spin coating as described in Reese, M. O.; White, M. S.; Rumbles, G.; Ginley, D. S.; Shaheen, S. E., Optimal negative electrodes for poly (3-hexylthiophene): [6,6]-phenyl C61-butyric acid methyl ester bulk heterojunction photovoltaic devices. *Appl. Phys. Lett.* 2008, 92, (5), 053307-3, the contents of which is incorporated by reference herein in its entirety.

Figure 12:
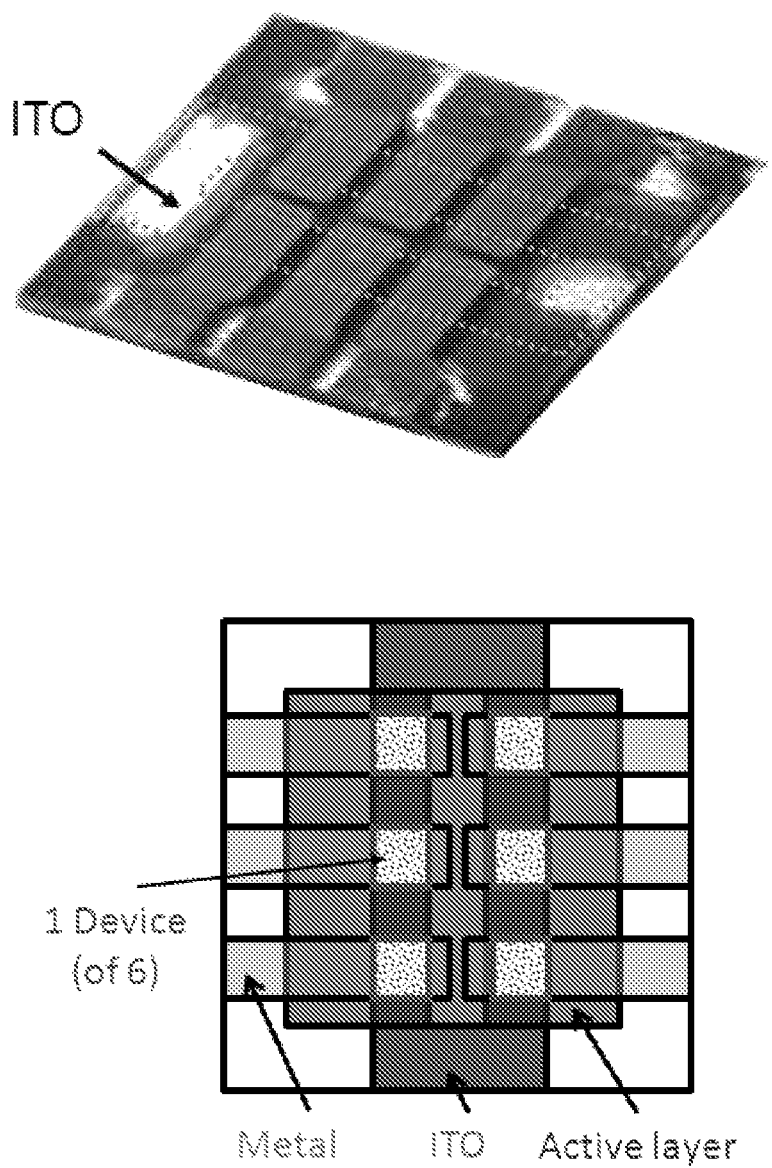
FIG. 12 is a photograph and schematic of an example set of six OPV devices where each device covers 0.11 cm$^2$ in accordance with certain embodiments.

A picture of the resulting device and the explanatory schematic are shown in FIG. 12.

In order to assess the effect of silica spheres on film morphology and subsequent performance, ratios (by weight) between PCBM:silica spheres of 6.14:1, 3:1, 1:1 and 1:3 were studied. As silica spheres are not active electron acceptors, toluene solutions containing 10 mg/mL of PCBM were prepared in all cases. 20 mg of P3HT were added to 2 mL aliquots of these solutions and devices prepared maintaining a 1-to-1 PCBM:P3HT ratio by weight. In addition, a PCBM:P3HT device, without the presence of any silica spheres, was prepared as a baseline. After an initial screening, six devices each were prepared for the baseline as well as 6.14:1 and 3:1 PCBM-silica ratio. Standard deviations were determined.

Table 1 below shows the characteristic of bulk heterojunction devices using P3HT and PCBM-silica mixtures. The devices were constructed and the device performance characteristics were measured similarly to the experiments described in Reese et al., "Optimal negative electrodes for poly(3-hexylthiophene:[6,6]-phenyl C61-butyric acid methyl ester bulk heterojunction photovoltaic devices," Applied Physics Letters, Vol. 92, 053307 (2008), which is incorporated by reference herein in its entirety.

TABLE 1

| PCBM: silica ratio | $V_{oc}$ (V) | $J_{SC}$ (mA cm$^{-2}$) | Fill Factor | Efficiency (%) |
|---|---|---|---|---|
| 1:0 (baseline) (100%) | 0.573 ± 0.01 | 5.85 ± 0.06 | 43.97 ± 2.50 | 1.41 ± 0.09 |
| 6.14:1 (86%) | 0.581 ± 0.002 | 5.95 ± 0.18 | 52.05 ± 2.69 | 1.73 ± 0.08 |
| 3:1 (75%) | 0.584 ± 0.003 | 5.65 ± 0.21 | 50.44 ± 2.07 | 1.71 ± 0.08 |

Figure 13:
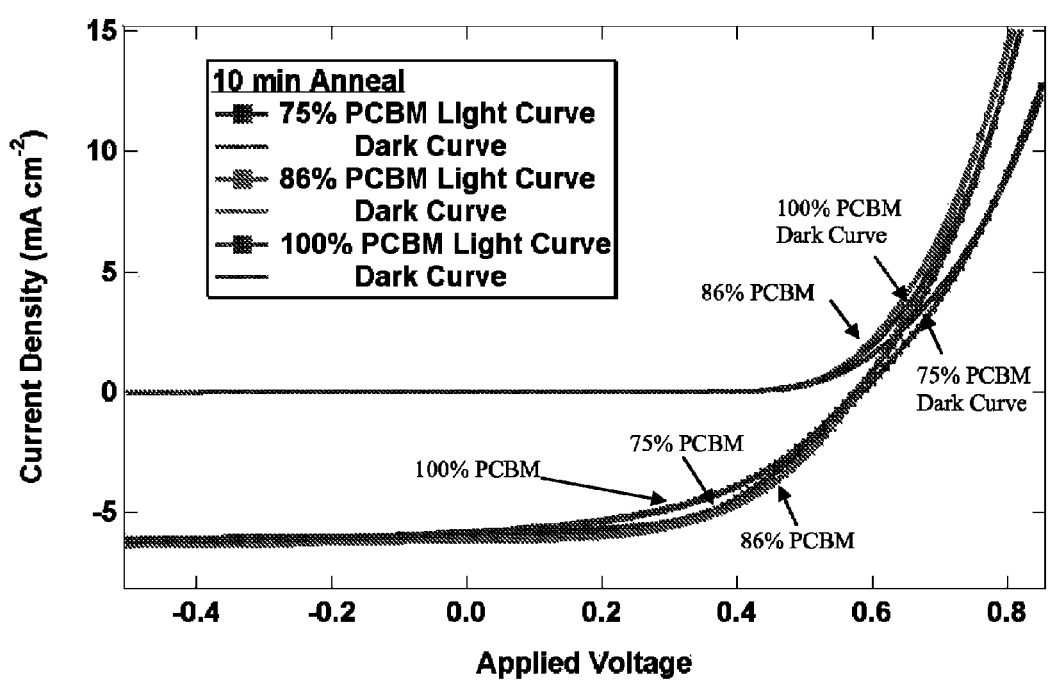
FIG. 13 show I-V curves of bulk heterojunction devices based on (a) PCBM:P3HT; (b) PCBM (86%)/silica (14%): P3HT and (c) PCBM (75%)/silica (25%):P3HT in accordance with certain embodiments.

As shown in Table 1 and illustrated in the I-V curves shown in FIG. 13, statistically meaningful improvements of performance of >20% compared to the PCBM:P3HT base case could be achieved using PCBM:silica spheres in 6.14:1 and 3:1 mixtures. Significant further improvements are likely to be possible as no optimization of critical process parameters, such as the p-phase/n-phase ratio, the annealing temperature or, particularly, the solvent system, was conducted.

Example 2

Covalent bonding of fullerenes to silica spheres was carried out. Experiments were conducted with commercially available water-based solutions of either —OH bearing or amino-functionalized silica spheres with a diameter of 10 nm. Attempts to form ester (—O—CO—CH$_2$—) or amide (—NH—CO—CH$_2$) bonds using [6,6]-phenyl-C$_{61}$-butyric acid (PCBA), carrying a carboxylic acid end group, had some success. IR spectroscopy and transmission electron microscopy (TEM) imaging showed some evidence of successful functionalization.

Example 3

Functionalization was also conducted using a commercially available toluene solution of —OH-bearing silica spheres with particle diameters between 10 and 15 nm, rendered soluble by the limited —OH functionalization (this same material was used in Example 1).

A transesterification method was successfully carried out to covalently link PCBM to silica. The use of di-n-butyltin oxide as the catalyst led to the formation of Si—O—CO—R ester functionalities, in harvestable yields and with significant reproducibility. The reaction was conducted in o-dichlorobenzene at 80° C. under nitrogen, allowing for higher concentrations of the reactants, particularly PCBM, and therefore reaction rates.

Analysis by HPLC using a silica gel chemically bonded with 3-(1-pyrenyl)propyl (Buckyprep, Nacalai USA, Inc.) with toluene as the eluent, showed the time-dependent growth of a new peak eluting between those of unreacted silica spheres dissolved in toluene and PCBM. Analysis by HPLC on a conventional unfunctionalized silica stationary phase indicated the growth of three new peaks after the characteristic PCBM one. Once the reaction completed, purification was carried out using a 40-60 micron silica bed using o-dichlorobenzene as the eluent. This process resulted in the recovery of unreacted PCBM followed by two distinguished bands.

Figure 14:
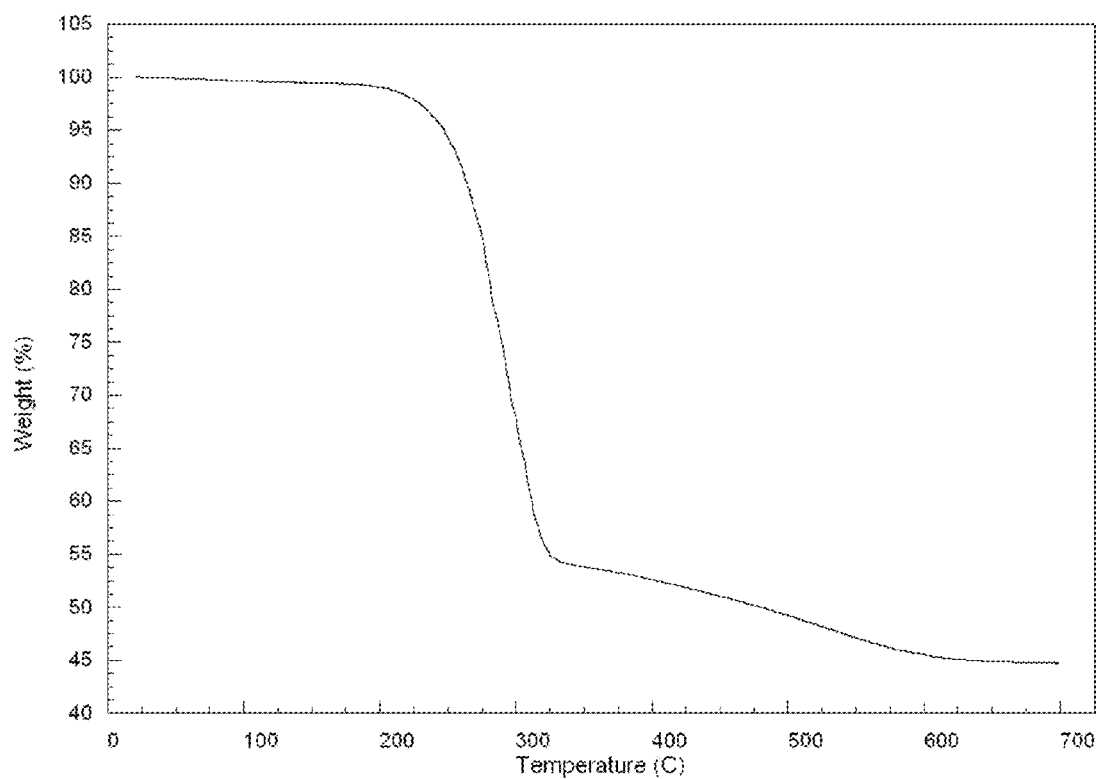
FIG. 14 is a thermogravimetric analysis (TGA) under air of covalently bonded PCBM-silica using a heating rate of 7.5K/min in accordance with certain embodiments.

Thermogravimetric analysis (TGA) under air confirmed the presence of both organic and inorganic, non-oxidizing material in the reaction mixture. The largest fraction collected during chromatography (~200 mg), was found to be the most soluble in toluene (>20 mg/mL) as well as o-dichlorobenzene (>16 mg/mL) and was further analyzed in some detail. TGA of this material, shown in FIG. 14, shows oxidation of material (probably PCBM) at 250° C. representing approximately 45% of the total mass, followed by an additional 10% gradual weight loss. Comparison with the TGA of the unfunctionalized toluene-soluble silica spheres shows a similar 10% weight loss, most likely explained by the functional groups added in the commercial product in order to achieve solubility. As the TGA plot given in FIG. 14 is significantly different from those of unfunctionalized silica spheres and PCBM (wherein oxidation starts at approximately 475° C.), the presence of a simple silica-PCBM mixture without covalent bonding can be excluded.

Figure 15:
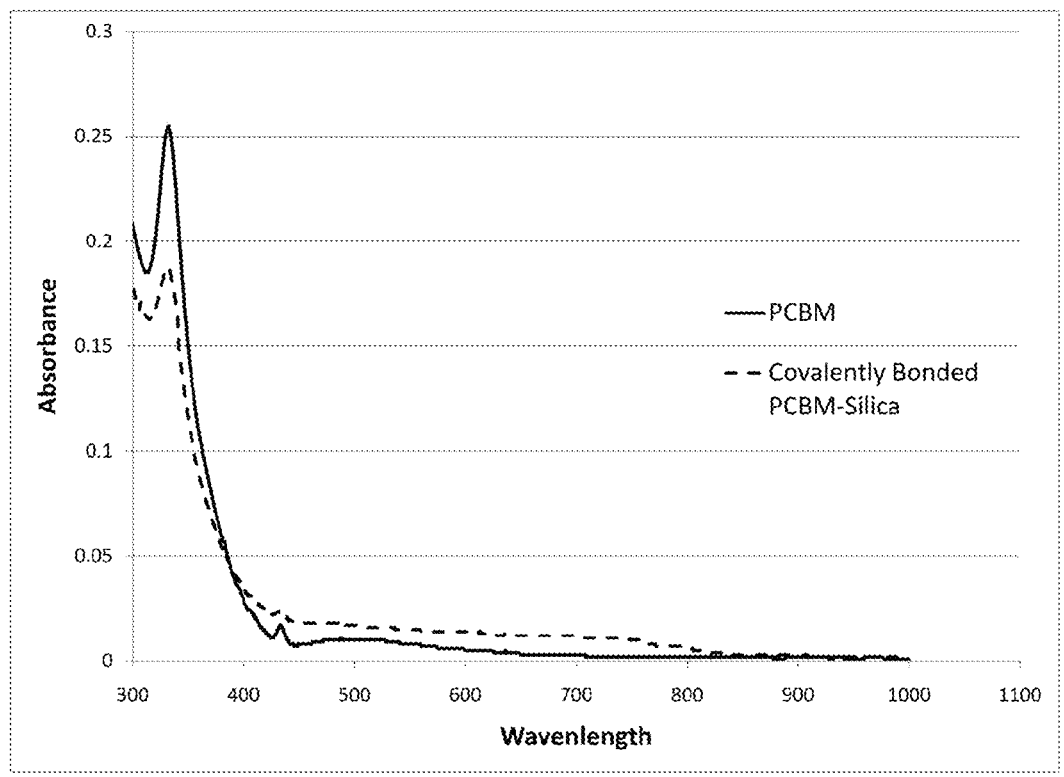
FIG. 15 is a UV-vis spectrum of (a) unfunctionalized silica spheres and (b) covalently bonded PCBM-silica in accordance with certain embodiments.

However, a UV-vis spectrum of the toluene solution has been measured and its pronounced similarity to the corresponding PCBM spectrum (FIG. 15) is consistent with the very limited absorbance of silica in this part of the electromagnetic spectrum. This confirms the expectation that covalent attachment of PCBM to silica does not significantly affect the electronic structure.

Figure 16:
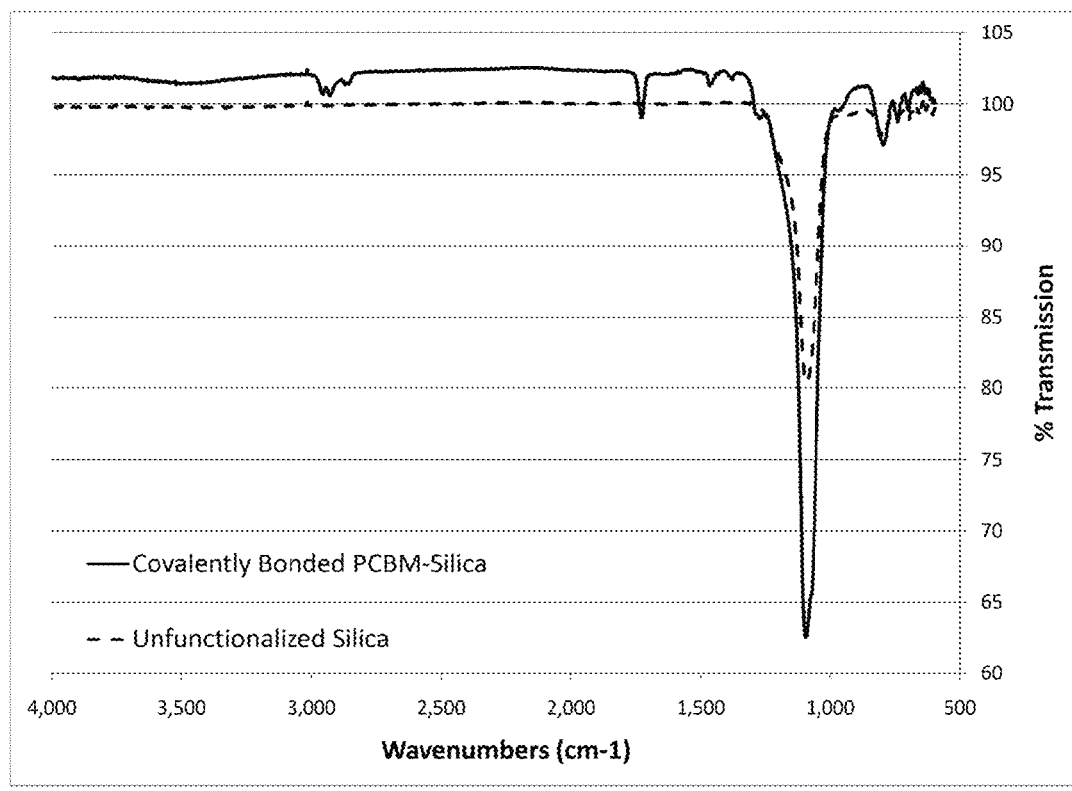
FIG. 16 is an infrared spectrum of (a) unfunctionalized silica spheres and (b) covalently bonded PCBM-silica in accordance with certain embodiments.

Further confirmation of the composition of the collected product has been obtained by IR spectroscopy. Comparison of unfunctionalized silica spheres and the reaction product (FIG. 16) shows the presence of silanol Si—O stretches (~940 cm$^{-1}$) and Si—O—Si asymmetric stretches (1200 to 1000 cm$^{-1}$) in both spectra while saturated carbonyl (C=O) stretches (~1729 cm$^{-1}$) and asymmetric (2920 to 2970 cm$^{-1}$) C—H stretches, consistent with the PCBM spectrum which shows peaks at ~2960 cm$^{-1}$, 1736 cm$^{-1}$ on this instrument, can only be observed with the covalently bonded PCBM-silica sample. In addition, IR bands around 1180 cm$^{-1}$ (the shoulder left of the asymmetric Si—O—Si stretch) and around 1430 cm$^{-1}$ are in agreement with the presence of C$_{60}$ fullerene as a structural unit. It can therefore be concluded that the synthesis of Inorganic Core-Fullerene Shell (IC-FS), i.e., covalently bonded fullerene-silica compounds has been successful.

Upon review of the description and embodiments of the present invention, those skilled in the art will understand that modifications and equivalent substitutions may be performed in carrying out the invention without departing from the essence of the invention. Thus, the invention is not meant to be limiting by the embodiments or descriptions provided explicitly above.

What is claimed is:

1. A Photovoltaic device comprising:
    a transparent electrode;
    a counter electrode; and
    an active layer between said transparent electrode and said counter electrode;
wherein said active layer comprises
    an electron donating phase; and
    an electron accepting phase comprising a plurality of core-shell particles that comprises a plurality of non-conducting core particles and fullerenes
    wherein the fullerenes partially or completely cover each non-conducting core particles of the electron accepting phase to form the core-shell particles;
    wherein said non-conducting core particles are selected from a ceramic, a polymer, silica or combinations thereof; and
    wherein said electron donating phase and said electron accepting phase form an interpenetrating network.

2. The device of claim 1, wherein said non-conducting core particles comprise silica particles.

3. The device of claim 1, wherein said fullerenes is bound to said non-conducting core particle through physical or chemical bonding.

4. The device of claim 1, wherein said electron donating phase comprises a conducting polymer.

5. The device of claim 1, wherein a plurality of fullerenes is attached to the non-conducting core particle via covalent interactions to form a shell around said non-conducting core particle.

6. The device of claim 1, wherein said electron donating phase and said electron accepting phase have at least one dimension of the interpenetrating network that is less than about 100 nm.

7. The device of claim 1, wherein said electron donating phase and said electron accepting phase have at least one dimension of the interpenetrating network that is less than about 20 nm.

8. The device of claim 1, wherein said non-conducting core particle is spherical, monodisperse silica having a diameter of about 10 to 20 nm.

9. A method for forming the photovoltaic device of claim 1, comprising:
    forming an interpenetrating network of an electron donating phase and an electron accepting phase, wherein said electron accepting phase comprises a plurality of core-shell particles that comprises a plurality of non-conducting core particles and fullerenes;
    wherein the fullerenes partially or completely cover each of the non-conducting core particles of the electron accepting phase to form the core-shell particles;
    wherein said non-conducting core particles are selected from a ceramic, a polymer, silica or combinations thereof; and
    providing the interpenetrating network between a transparent electrode and a counter electrode.

10. The method of claim 9, wherein said forming an interpenetrating network comprises:
    making a mixture of an electron donating material and said plurality of non-conducting core particles having a shell of fullerenes; and
    depositing said mixture over the transparent electrode or the counter electrode.

* * * * *